(12) United States Patent
Wang et al.

(10) Patent No.: US 12,527,070 B2
(45) Date of Patent: Jan. 13, 2026

(54) METHOD FOR FORMING WELLS FOR SEMICONDUCTOR DEVICES USING IMPLANATIONS OF INCREASING ENERGY

(71) Applicant: TAIWAN SEMICONDUCTOR MANUFACTURING COMPANY, LTD., Hsinchu (TW)

(72) Inventors: Bau-Ming Wang, Hsinchu (TW); Liang-Yin Chen, Hsinchu (TW); Huicheng Chang, Hsinchu (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 265 days.

(21) Appl. No.: 17/854,997

(22) Filed: Jun. 30, 2022

(65) Prior Publication Data

US 2024/0006247 A1 Jan. 4, 2024

(51) Int. Cl.
*H10D 84/03* (2025.01)
*H01L 21/265* (2006.01)
*H10D 84/01* (2025.01)

(52) U.S. Cl.
CPC ....... *H10D 84/038* (2025.01); *H01L 21/2652* (2013.01); *H10D 84/0191* (2025.01)

(58) Field of Classification Search
CPC ........ H01L 21/823892; H01L 21/2652; H10D 84/038; H10D 84/0191
See application file for complete search history.

(56) References Cited

U.S. PATENT DOCUMENTS

| | | | | |
|---|---|---|---|---|
| 5,134,501 A | * | 7/1992 | Satomi | H04N 1/32614 358/405 |
| 5,489,540 A | * | 2/1996 | Liu | H01L 21/823892 438/231 |
| 5,686,324 A | * | 11/1997 | Wang | H01L 29/6659 257/E21.345 |
| 5,795,803 A | * | 8/1998 | Takamura | H01L 21/823892 438/529 |
| 5,904,551 A | * | 5/1999 | Aronowitz | H01L 21/26586 257/E21.336 |
| 2002/0102796 A1 | * | 8/2002 | Lee | H01L 21/823842 438/283 |
| 2015/0380285 A1 | * | 12/2015 | Huseinovic | H01J 37/20 414/217 |
| 2019/0393040 A1 | * | 12/2019 | Chen | H01L 21/26586 |

* cited by examiner

*Primary Examiner* — Richard A Booth
(74) *Attorney, Agent, or Firm* — Birch, Stewart, Kolasch & Birch, LLP

(57) ABSTRACT

A method for manufacturing a semiconductor device includes: forming a first type well in a substrate; and after forming the first type well in the substrate, forming a second type well in the substrate, where the second type well has a conductivity type different from that of the first type well. One of the first and second type wells is formed by sequentially performing multiple ion implantations that use different energies, and one of the ion implantations that uses a lowest energy among the ion implantations is performed first among the ion implantations.

20 Claims, 17 Drawing Sheets

METHOD FOR FORMING WELLS FOR SEMICONDUCTOR DEVICES USING IMPLANTATIONS OF INCREASING ENERGY

BACKGROUND

The semiconductor integrated circuit (IC) industry has over the past decades experienced tremendous advancements and is still experiencing vigorous development. With the dramatic advances in IC design, it is a big challenge to reduce sub-fin leakage in a transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
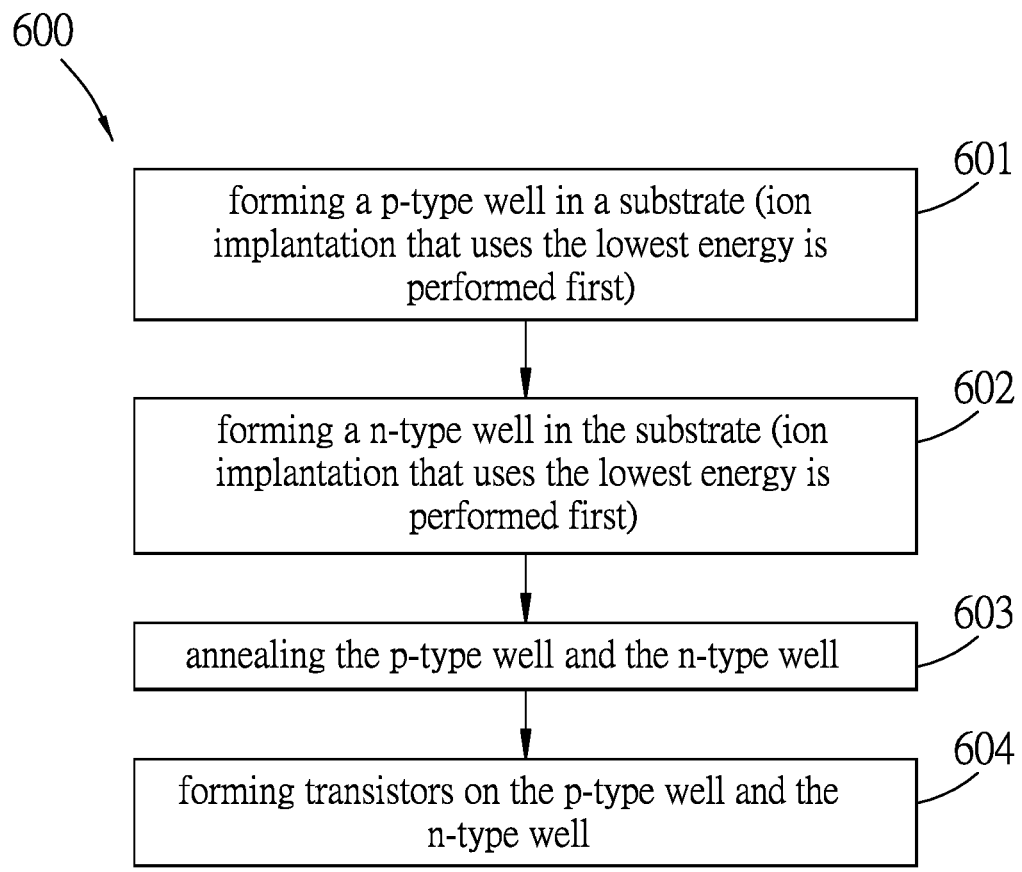
FIG. 1 is a flow chart illustrating a method for manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

FIG. 1 is a flow chart illustrating a method 600 for manufacturing a semiconductor device in accordance with some embodiments. FIGS. 2 to 34 are schematic sectional views of semiconductor structures 700 during various stages of the method 600. The method 600 and the semiconductor structures 700 are collectively described below. However, additional steps can be provided before, after or during the method 600, and some of the steps described herein may be replaced by other steps or be eliminated. Similarly, further additional features may be present in the semiconductor structures 700, and/or features present may be replaced or eliminated in additional embodiments.

Figure 2:
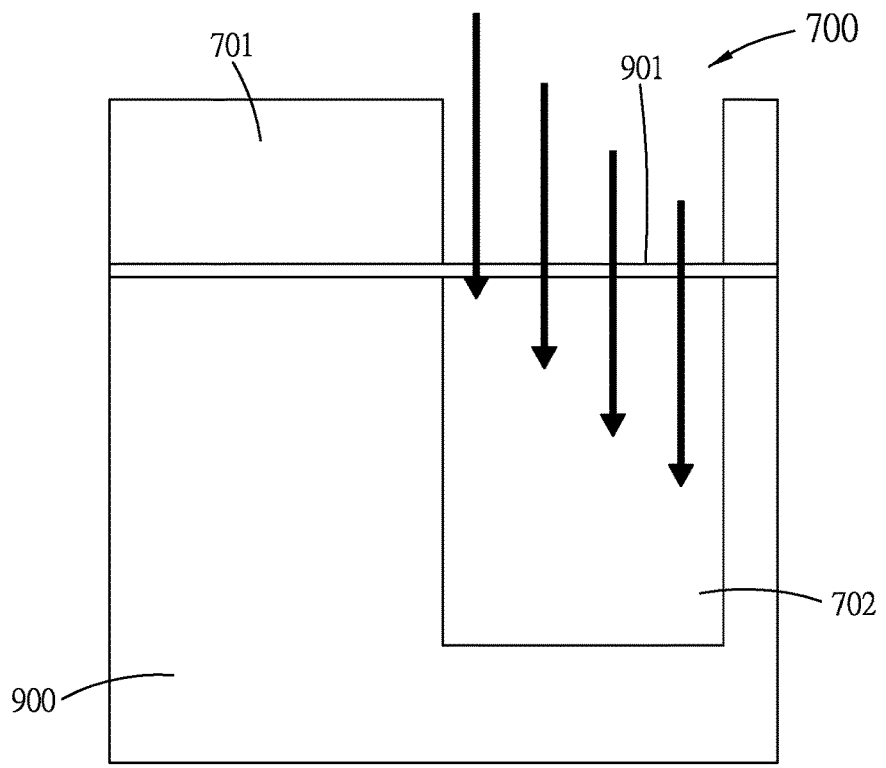
FIGS. 2 to 34 are schematic sectional views illustrating intermediate stages of the method for manufacturing a semiconductor device in accordance with some embodiments.

Referring to FIGS. 1 and 2, a substrate 900 is provided with a pad oxide 901 formed thereon. In some embodiments, the substrate 900 may be a silicon substrate, and the pad oxide 901 may include silicon oxide. The method 600 begins at block 601, where at least one p-type well 702 is formed in the substrate 900. FIG. 2 only depicts one of the at least one p-type well 702 for simplicity. Block 601 may be implemented as described below. Firstly, a masking layer 701 is coated on the pad oxide 901, and is patterned to form at least one opening. Secondly, multiple p-type ion implantations that use different energies are sequentially performed to implant p-type dopants into the substrate 900 through the at least one opening, so as to form the at least one p-type well 702 in the substrate 900. The patterned masking layer 701 may be removed after the at least one p-type well 702 is formed. In some embodiments, the masking layer 701 may be a photoresist or a hard mask, and may have a multi-layer structure (e.g., a bi-layer structure or a tri-layer structure). In some embodiments, the p-type dopants may include boron, $BF_2$, other suitable materials, or combinations thereof. One of the p-type ion implantations that uses a lowest energy among the p-type ion implantations would form a punch through stop layer in a sub-fin region of each of the at least one p-type well 702, so as to suppress sub-fin leakage. The sub-fin region of the p-type well 702 is an uppermost region of the p-type well 702 with a thickness of about 50 nm.

Figure 3:
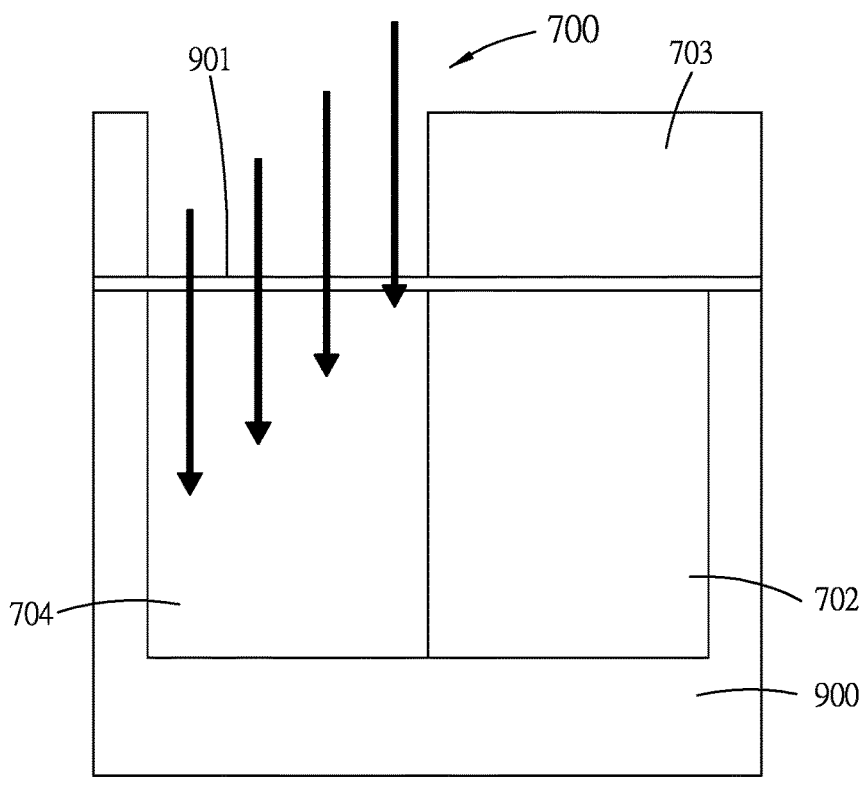

Referring to FIGS. 1 and 3, the method 600 then proceeds to block 602, where at least one n-type well 704 is formed in the substrate 900. FIG. 3 only depicts one of the at least one n-type well 704 for simplicity. Block 602 may be implemented as described below. Firstly, a masking layer 703 is coated on the pad oxide 901, and is patterned to form at least one opening. Secondly, multiple n-type ion implantations that use different energies are sequentially performed to implant n-type dopants into the substrate 900 through the at least one opening, so as to form the at least one n-type well 704 in the substrate 900. The patterned masking layer 703 may be removed after the at least one n-type well 704 is formed. In some embodiments, the masking layer 703 may be a photoresist or a hard mask, and may have a multi-layer structure (e.g., a bi-layer structure or a tri-layer structure). In some embodiments, the n-type dopants may include phosphorus, arsenic, indium, other suitable materials, or combinations thereof. One of the n-type ion implantations that uses a lowest energy among the n-type ion implantations would form a punch through stop layer in a sub-fin region of each of the at least one n-type well 704, so as to suppress sub-fin leakage. The sub-fin region of the n-type well 704 is an uppermost region of the n-type well 704 with a thickness of about 50 nm.

Figure 4:
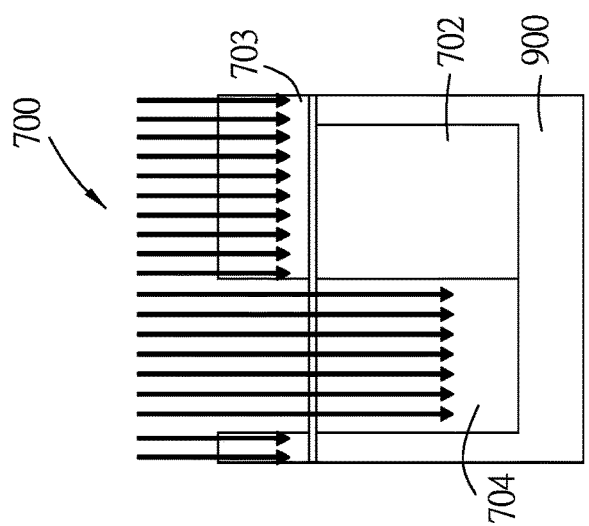
Figure 5:
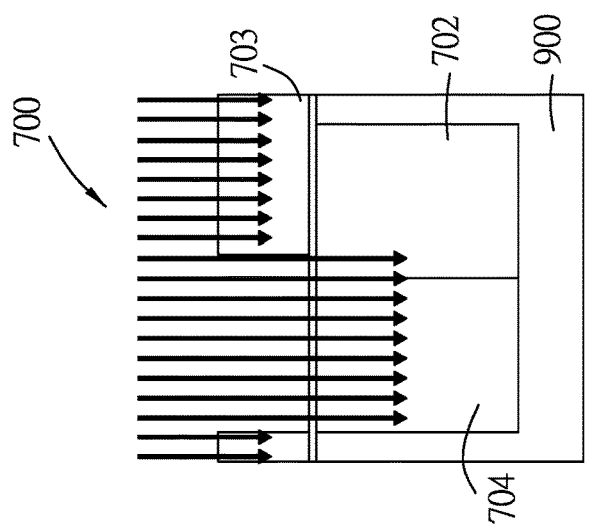
Figure 6:
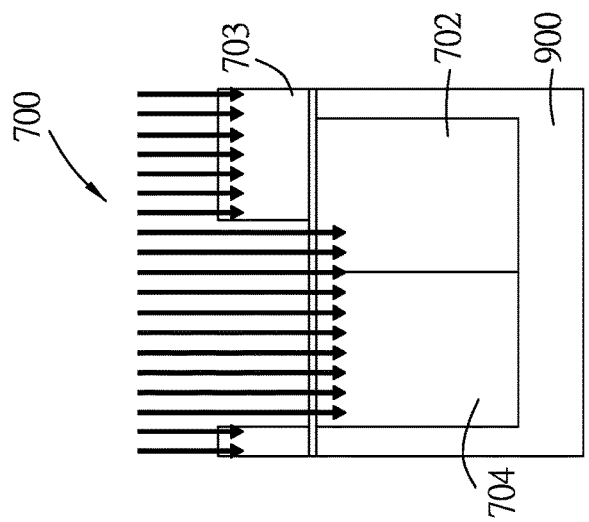

In some embodiments, the n-type ion implantation that uses the lowest energy may be performed last in block 602. In an example where a total number of the n-type ion implantations is three, the n-type ion implantations may be sequentially performed from the highest to the lowest energy as shown in FIGS. 4, 5 and 6. It should be noted that each n-type ion implantation may cause shrinkage of the patterned masking layer 703, so the n-type ion implantation that uses the lowest energy may introduce more n-type dopants (or n-type impurities) within the sub-fin region of each p-type well 702 when it is performed last among the n-type ion implantations, as compared to when it is performed first among the n-type ion implantations. Similarly, in some embodiments, the p-type ion implantation that uses the lowest energy may be performed last in block 601, and may introduce more p-type dopants (or p-type impurities) within the sub-fin region of each n-type well 704 when it is performed last among the p-type ion implantations, as compared to when it is performed first among the p-type ion implantations.

Figure 7:
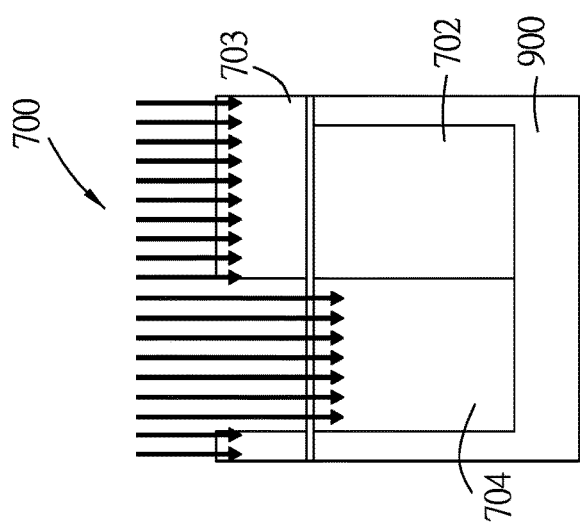
Figure 8:
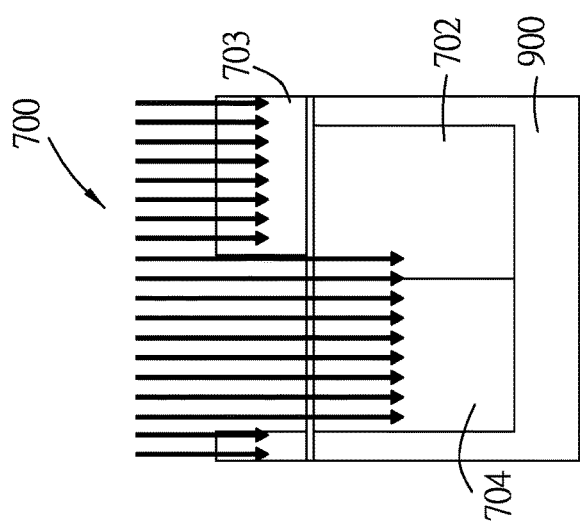
Figure 9:
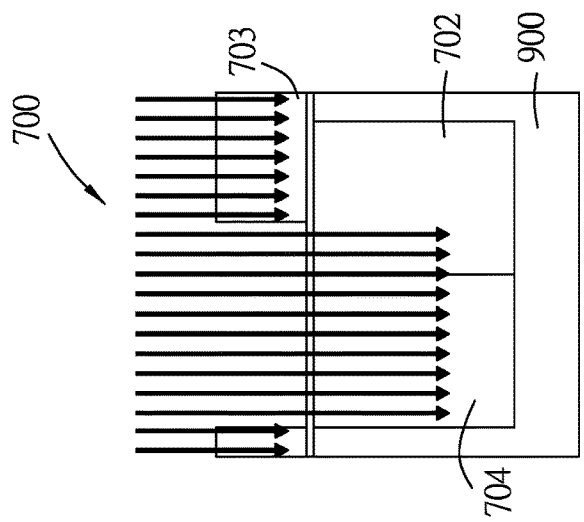
Figure 12:
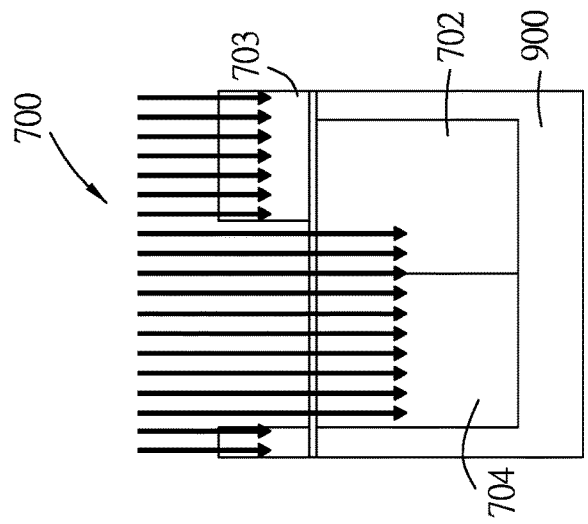
Figure 11:
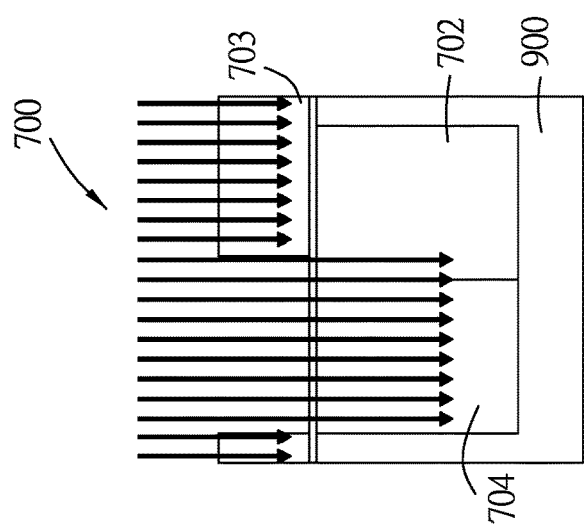
Figure 10:
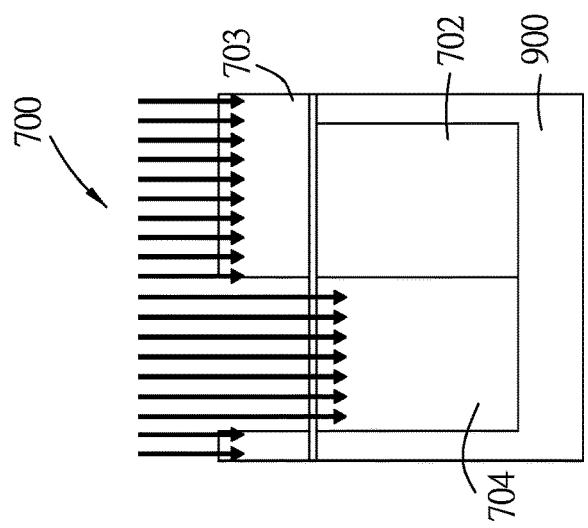

In some embodiments, the n-type ion implantation that uses the lowest energy may be performed first in block 602. In the example where the total number of the n-type ion implantations is three, the n-type ion implantations may be sequentially performed from the lowest to the highest energy as shown in FIGS. 7, 8 and 9; alternatively, the n-type ion implantations may be sequentially performed in an order of the lowest, highest and medium energies as shown in FIGS. 10, 11 and 12. It should be noted that each n-type ion implantation may cause shrinkage of the patterned masking layer 703, so the n-type ion implantation that uses the lowest energy may introduce less n-type dopants (or n-type impurities) within the sub-fin region of each p-type well 702 when it is performed first among the n-type ion implantations, as compared to when it is performed last among the n-type ion implantations. Similarly, in some embodiments, the p-type ion implantation that uses the lowest energy may be performed first in block 601, and may introduce less p-type dopants (or p-type impurities) within the sub-fin region of each n-type well 704 when it is performed first among the p-type ion implantations, as compared to when it is performed last among the p-type ion implantations.

It should be noted that the n-type ion implantations may be sequentially performed in an order the same as or different from that of the p-type ion implantations. In addition, when the p-type ion implantation that uses the lowest energy is performed first among the p-type ion implantations and the n-type ion implantation that uses the lowest energy is performed first among the n-type ion implantations, in the sub-fin regions of any two adjacent p-type and n-type wells 702, 704 and around a boundary between the two adjacent p-type and n-type wells 702, 704, a portion that is subjected to both p-type ion implantation and n-type ion implantation would be smaller.

In some embodiments, with respect to each of the p-type and n-type ion implantations, depending on a target dopant concentration profile of the corresponding p-type or n-type well 702/704, the ion implantation may be performed along an axis normal to a top surface of the substrate 900, or it may be a tilt implantation. The tilt implantation is performed at an angle with respect to the axis that is greater than 0 degrees, and that is smaller than or equal to 15 degrees.

In some embodiments, with respect to each of the p-type and n-type ion implantations, depending on the target dopant concentration profile of the corresponding p-type or n-type well 702/704, the ion implantation may be performed without rotating the substrate 900, or it may be a rotational implantation. The rotational implantation is performed as the substrate 900 is being rotated by angles that fall between 0 and 360 degrees.

In some embodiments, with respect to each of the p-type and n-type ion implantations, depending on the target dopant concentration profile of the corresponding p-type or n-type well 702/704, the ion implantation may be performed at a temperature that falls within a range of from −60° C. to 450° C. (i.e., the substrate 900 is adjusted to the temperature).

In an example where both of a total number of the p-type ion implantations and the total number of the n-type ion implantations are three, the p-type ion implantation that uses the lowest energy may be performed such that a concentration of the p-type dopants introduced into the substrate 900 by such ion implantation falls within a range of from $1\times10^{19}$ cm$^{-3}$ to $5\times10^{19}$ cm$^{-3}$, the p-type ion implantation that uses the medium energy may be performed such that a concentration of the p-type dopants introduced into the substrate 900 by such ion implantation falls within a range of from $5\times10^{18}$ cm$^{-3}$ to $1\times10^{19}$ cm$^{-3}$, the p-type ion implantation that uses the highest energy may be performed such that a concentration of the p-type dopants introduced into the substrate 900 by such ion implantation falls within a range of from $1\times10^{18}$ cm$^{-3}$ to $5\times10^{18}$ cm$^{-3}$, the n-type ion implantation that uses the lowest energy may be performed such that a concentration of the n-type dopants introduced into the substrate 900 by such ion implantation falls within a range of from $1\times10^{19}$ cm$^{-3}$ to $5\times10^{19}$ cm$^{-3}$, the n-type ion implantation that uses the medium energy may be performed such that a concentration of the n-type dopants introduced into the substrate 900 by such ion implantation falls within a range of from $5\times10^{18}$ cm$^{-3}$ to $1\times10^{19}$ cm$^{-3}$, and the n-type ion implantation that uses the highest energy may be performed such that a concentration of the n-type dopants introduced into the substrate 900 by such ion implantation falls within a range of from $1\times10^{18}$ cm$^{-3}$ to $5\times10^{18}$ cm$^{-3}$.

In the example where both of the total number of the p-type ion implantations and the total number of the n-type ion implantations are three, the p-type ion implantations may be performed to implant boron into the substrate 900, with the lowest energy falling within a range of from 3 keV to 7 keV, the medium energy falling within a range of from 10 keV to 20 keV, and the highest energy falling within a range of from 20 keV to 50 keV; and the n-type ion implantations may be performed to implant phosphorus into the substrate 900, with the lowest energy falling within a range of from 7 keV to 13 keV, the medium energy falling within a range of from 25 keV to 55 keV, and the highest energy falling within a range of from 55 keV to 120 keV. Alternatively, the p-type ion implantation that uses the lowest energy may be performed to implant $BF_2$ into the substrate 900, with the lowest energy falling within a range of from 10 keV to 20 keV. Alternatively, the n-type ion implantation that uses the lowest energy may be performed to implant arsenic into the substrate 900, with the lowest energy falling within a range of from 10 keV to 20 keV.

The method 600 then proceeds to block 603, where the p-type and n-type wells 702, 704 are annealed so as to repair damages caused by ion implantation and to activate the p-type and n-type dopants that were implanted.

In some embodiments, the substrate 900 may be heated at least when the p-type ion implantation that uses the lowest energy and the n-type ion implantation that uses the lowest energy are being performed, so less point defects would be created in the p-type and n-type wells 702, 704, and less lateral diffusion of the p-type and n-type dopants from the sub-fin regions of the p-type and n-type wells 702, 704 into the sub-fin regions of the n-type and p-type wells 704, 702 would occur when the p-type and n-type wells 702, 704 are annealed.

The method 600 then proceeds to block 604, where the pad oxide 901 is removed, and a plurality of transistors (not shown) are formed on the p-type and n-type wells 702, 704.

Figure 13:
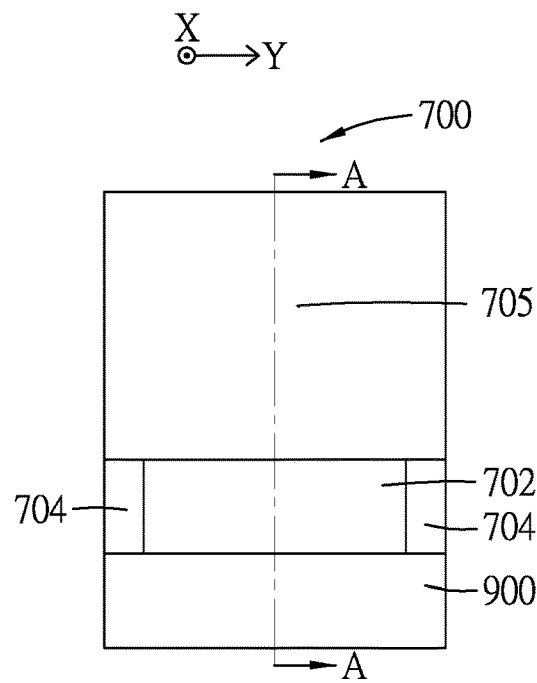
Figure 14:
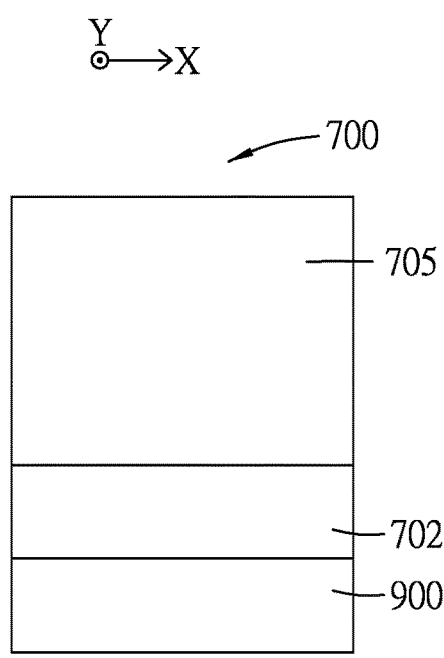
Figure 15:
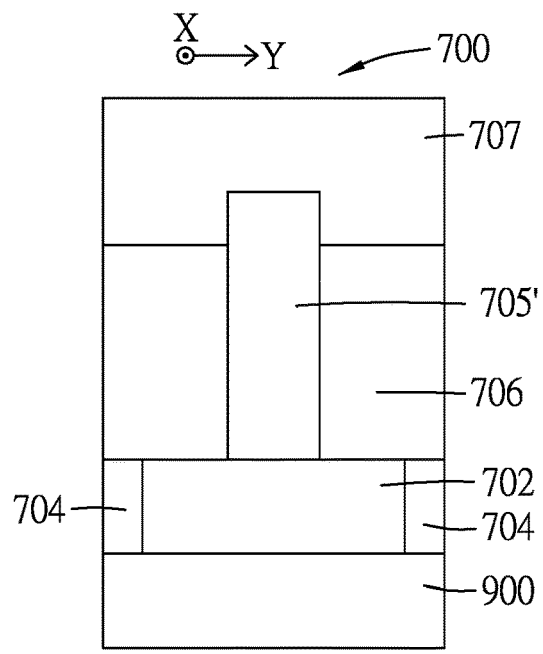
Figure 16:
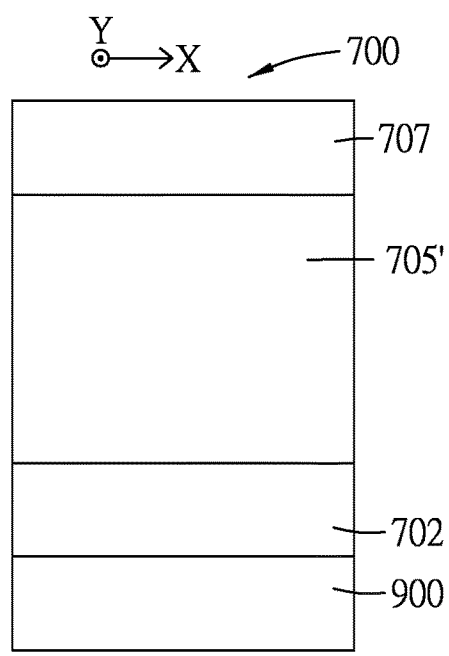
Figure 17:
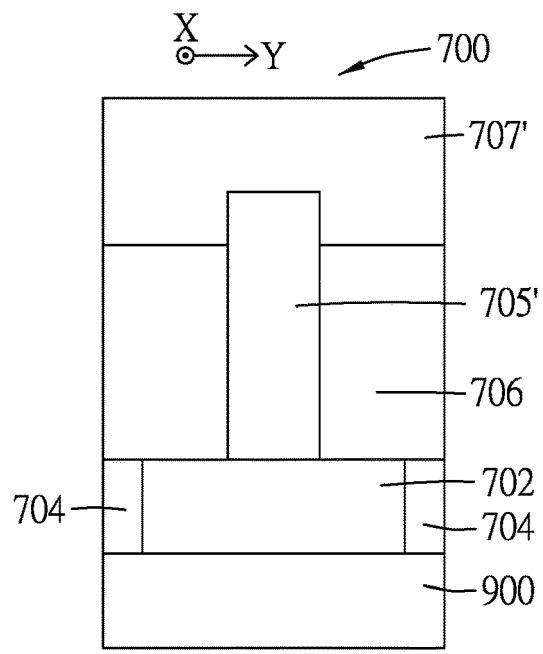
Figure 18:
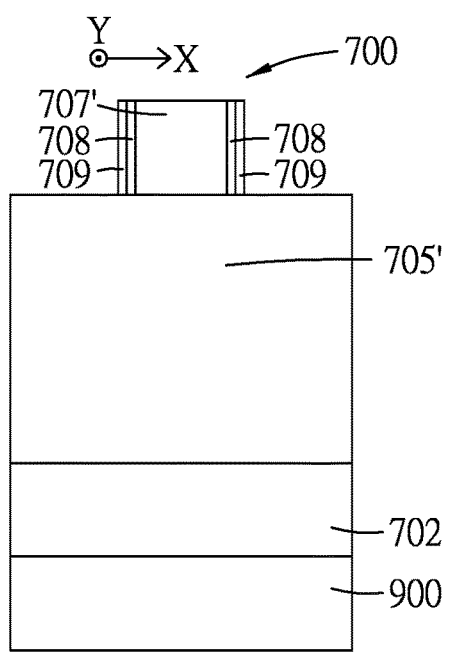

FIGS. 13 to 22 are schematic sectional views of semiconductor structures 700 during various stages of a method for forming an n-type fin field-effect transistor (FinFET) on a p-type well 702 in accordance with some embodiments. The exemplary scenario depicted in these figures is that one p-type well 702 is formed between two n-type wells 704. FIG. 14 is a schematic section view taken along line A-A of FIG. 13; FIGS. 15, 17, 19 and 21 are views similar to FIG. 13; and FIGS. 16, 18, 20 and 22 are views similar to FIG. 14.

At first, as shown in FIGS. 13 and 14, a semiconductor layer 705 is formed on the p-type well 702 and the n-type wells 704. In some embodiments, the semiconductor layer 705 may be epitaxially formed using, for example, low pressure chemical vapor deposition (LPCVD), other suitable techniques, or combinations thereof. In some embodiments, the semiconductor layer 705 may include group IV semiconductor, group III-V semiconductor, group II-VI semiconductor, other suitable materials, or combinations thereof. For example, the semiconductor layer 705 may be a silicon layer, but the disclosure is not limited in this respect.

Then, as shown in FIGS. 13, 14, 15 and 16, the semiconductor layer 705 is patterned to form a fin structure 705' on the p-type well 702, a shallow trench isolation (STI) layer 706 is formed on the p-type well 702 and the n-type wells 704 to cover a lower portion of the fin structure 705', and a dummy gate layer 707 is formed on the fin structure 705' and the STI layer 706. In some embodiments, the semiconductor layer 705 may be patterned using a photolithography process and an etching process. The photolithography process may include, for example, but not limited to, coating the semiconductor layer 705 with a photoresist, soft-baking, exposing the photoresist through a photomask, post-exposure baking, developing the photoresist, and hard-baking, so as to form a patterned photoresist. The etching process may be implemented by etching the semiconductor layer 705 through the patterned photoresist using, for example, dry etching, wet etching, reactive ion etching (RIE), atomic layer etching (ALE), other suitable techniques, or combinations thereof. The patterned photoresist may be removed after the etching process. In some embodiments, each of the STI layer 706 and the dummy gate layer 707 may be formed using, for example, chemical vapor deposition (CVD), plasma enhanced chemical vapor deposition (PECVD), physical vapor deposition (PVD), atomic layer deposition (ALD), other suitable techniques, or combinations thereof. In some embodiments, the STI layer 706 may include, for example, oxide (e.g., silicon oxide), nitride, other suitable materials, or combinations thereof. In some embodiments, the dummy gate layer 707 may include, for example, polysilicon, other suitable materials, or combinations thereof.

Next, as shown in FIGS. 15, 16, 17 and 18, the dummy gate layer 707 is patterned to form a dummy gate 707', first spacers 708 are respectively formed on sidewalls of the dummy gate 707', and second spacers 709 are respectively formed on the first spacers 708. In some embodiments, the dummy gate layer 707 may be patterned using a photolithography process and an etching process similar to those used to pattern the semiconductor layer 705 (see FIGS. 13 and 14). In some embodiments, the first and second spacers 708, 709 may be formed by conformally and sequentially depositing two dielectric layers for forming the first and second spacers 708, 709 using, for example, CVD, ALD, other suitable techniques, or combinations thereof, followed by one or more etching processes to selectively leave the first and second spacers 708, 709 remaining on the sidewalls of the dummy gate 707'. In some embodiments, the first and second spacers 708, 709 may include, for example, B(C)N-based materials, $SiO_xC_yN_z$-based materials, silicon nitride, other suitable materials, or combinations thereof.

Figure 19:
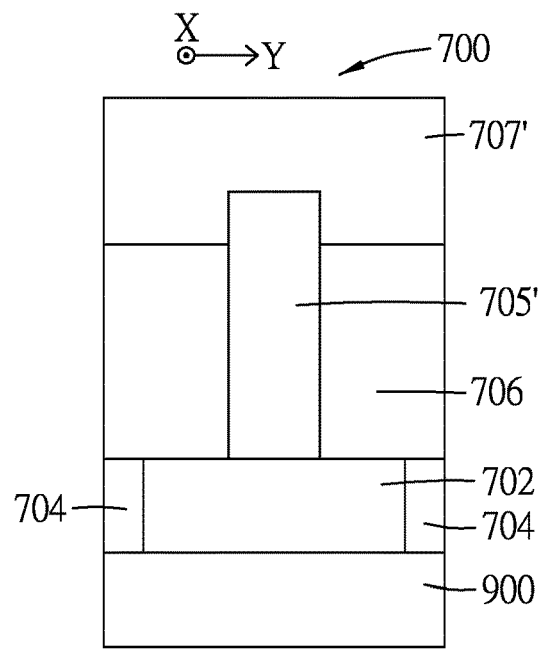
Figure 20:
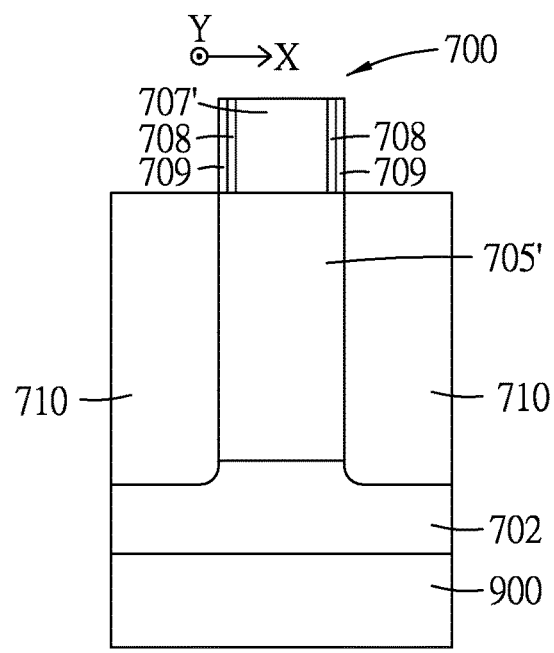

Then, as shown in FIGS. 19 and 20, source/drain electrodes 710 are formed in the fin structure 705' at opposite sides of the dummy gate 707'. In some embodiments, the fin structure 705' may be etched using, for example, dry etching, wet etching, RIE, ALE, other suitable techniques, or combinations thereof, so as to form recesses in the fin structure 705' at the opposite sides of the dummy gate 707'; and the source/drain electrodes 710 may be epitaxially formed in the recesses using, for example, LPCVD, other suitable techniques, or combinations thereof. In some embodiments, the source/drain electrodes 710 may include, for example, silicon, silicon carbide, phosphorous doped silicon carbide, silicon phosphide, other suitable materials, or combinations thereof.

Figure 21:
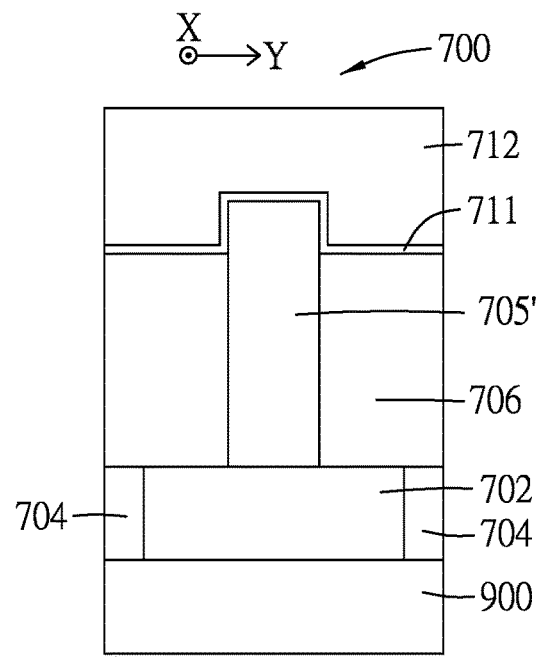
Figure 22:
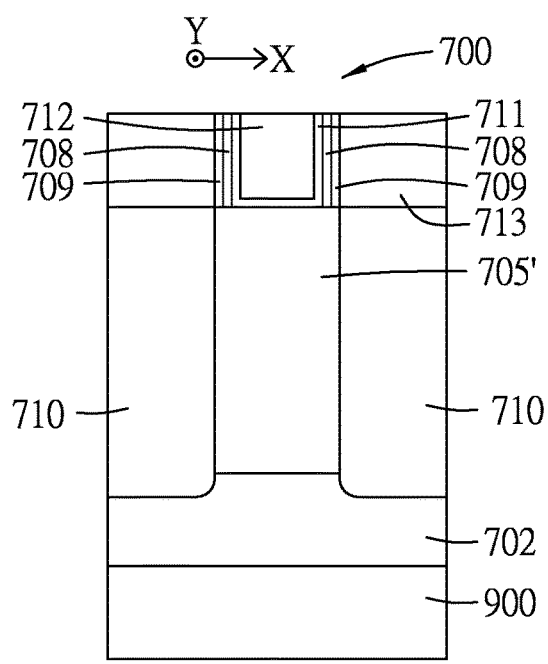

A process for forming the structure shown in FIGS. 21 and 22 may include (i) conformally depositing a dielectric layer for forming an interlayer dielectric (ILD) layer 713 over the structure shown in FIG. 20, (ii) performing a planarization process to remove an excess of the dielectric layer to expose the dummy gate 707' to thereby form the ILD layer 713, (iii) removing the dummy gate 707' using, for example, dry etching, wet etching, RIE, ALE, other suitable techniques, or combinations thereof to form a trench between the first spacers 708, (iv) conformally depositing materials for forming a gate dielectric 711 and a gate electrode 712 over the ILD layer and inner surfaces of the trench using, for example, PVD, CVD, ALD, other suitable techniques, or combinations thereof, and (v) performing planarization to remove an excess of the materials to obtain the gate dielectric 711 and the gate electrode 712. In some embodiments, the gate dielectric 711 may include, for example, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, silicon oxynitrides (SiON), other suitable materials, or combinations thereof. In some embodiments, the gate electrode 712 may include, for example, Ti, Ag, Al, TiAlN, TaC, TaCN, TaSiN, Mn, Zr, TiN, TaN, Ru, Mo, Al, WN, Cu, W, other suitable materials, or combinations thereof.

A method for forming a p-type FinFET on an n-type well 704 in accordance with some embodiments is similar to the method for forming an n-type FinFET on a p-type well 702, but differs from the method for forming an n-type FinFET on a p-type well 702 in that the source/drain electrodes 710 may include, for example, silicon-germanium, boron doped silicon-germanium, germanium, germanium tin, other suitable materials, or combinations thereof.

Figure 23:
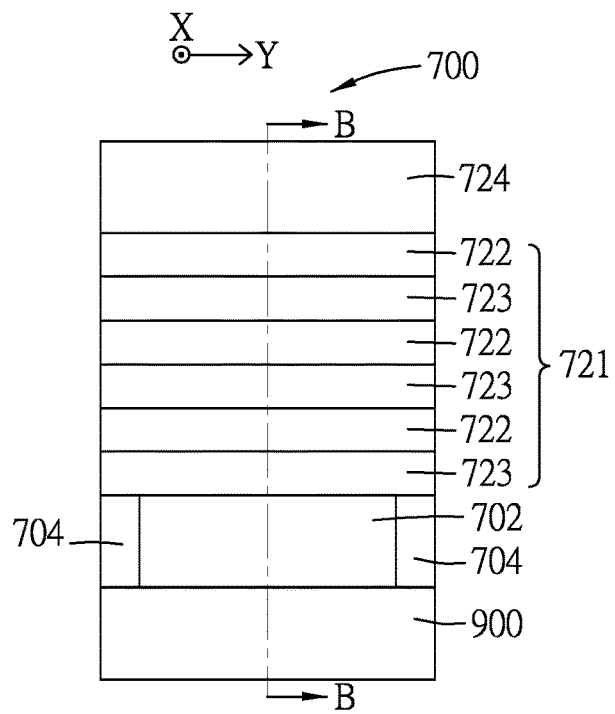
Figure 24:
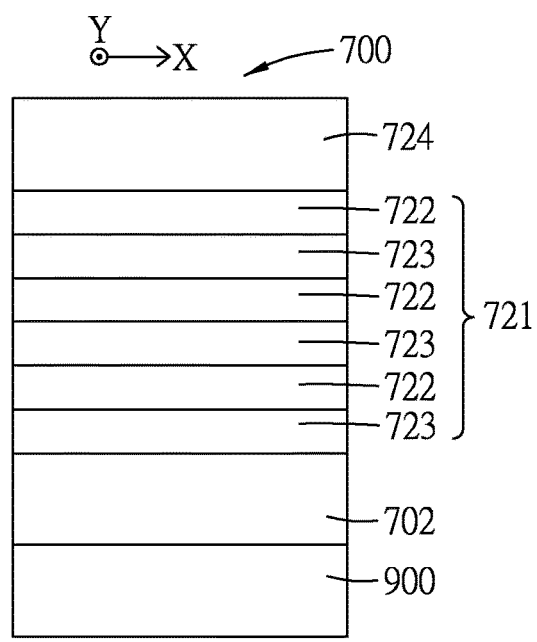
Figure 25:
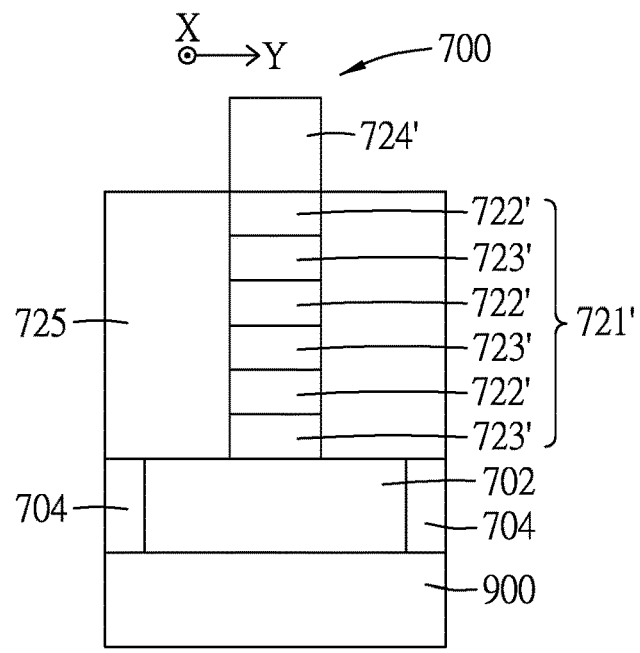
Figure 26:
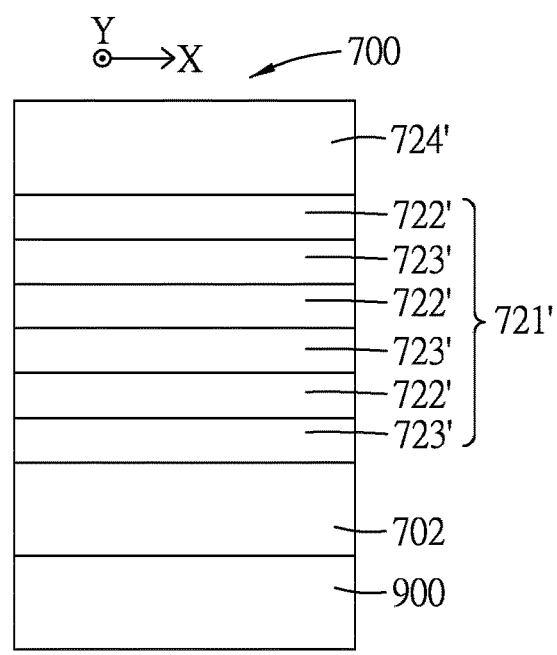
Figure 27:
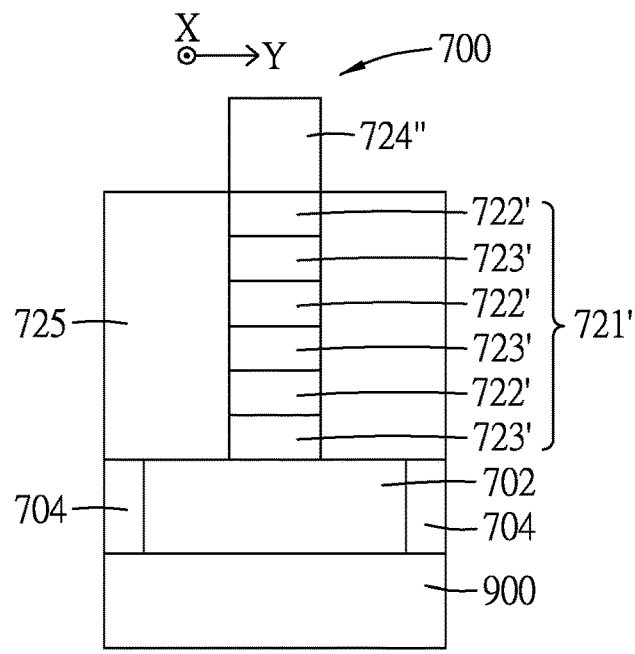
Figure 28:
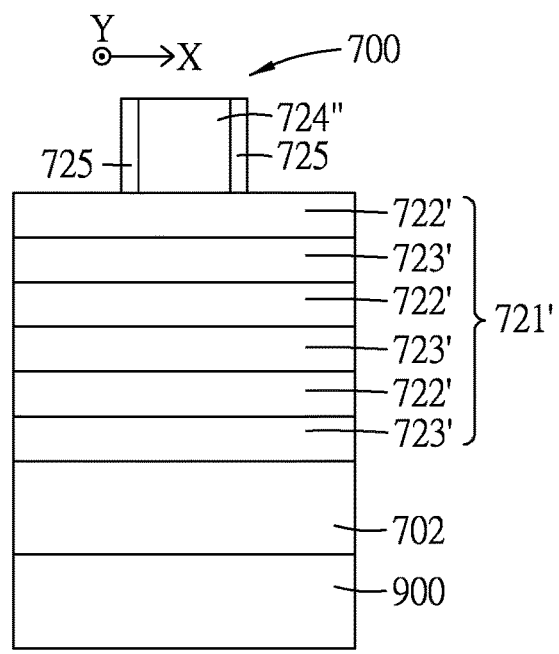
Figure 29:
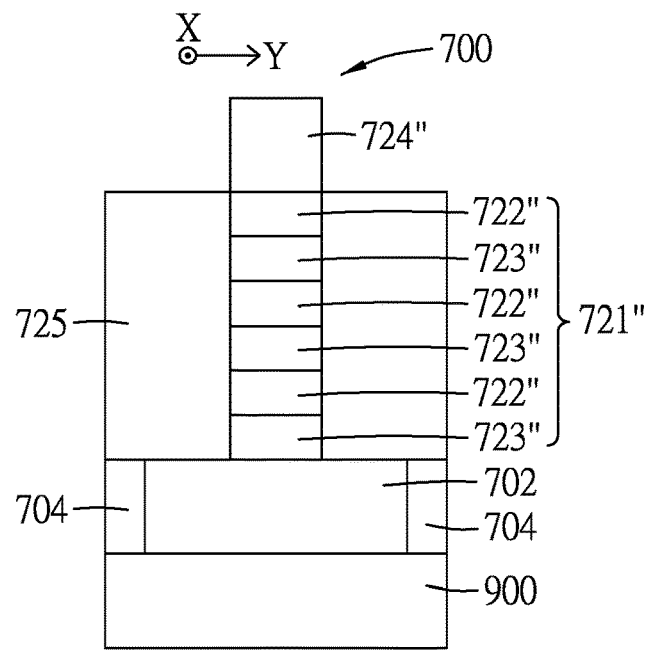
Figure 30:
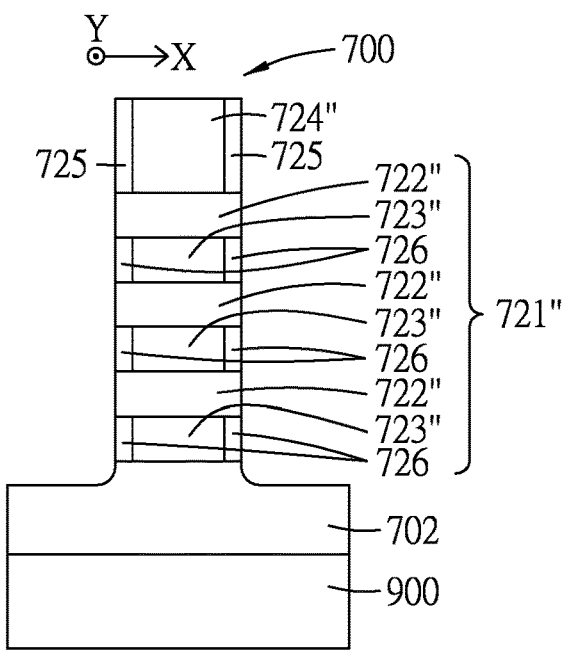

FIGS. 23 to 34 are schematic sectional views of semiconductor structures 700 during various stages of a method for forming an n-type nanosheet FET on a p-type well 702 in accordance with some embodiments. The exemplary scenario depicted in these figures is that the p-type well 702 is formed between two n-type wells 704. FIG. 24 is taken along line B-B in FIG. 23; FIGS. 25, 27, 29, 31 and 33 are views similar to FIG. 23; and FIGS. 26, 28, 30, 32 and 34 are views similar to FIG. 24.

At first, as shown in FIGS. 23 and 24, a semiconductor layer stack 721 and a dummy gate layer 724 are sequentially formed on the p-type well 702 and the n-type wells 704. The semiconductor layer stack 721 includes first semiconductor layers 722 and second semiconductor layers 723 stacked in an alternating manner. The first semiconductor layers 722 include a semiconductor material different from that of the second semiconductor layers 723. In some embodiments, the first semiconductor layers 722 may include group IV semiconductor, group III-V semiconductor, group II-VI semiconductor, other suitable materials, or combinations thereof. In some embodiments, the second semiconductor layers 723 may include group IV semiconductor, group III-V semiconductor, group II-VI semiconductor, other suitable materials, or combinations thereof. For example, the first semiconductor layers 722 may be silicon layers, and the second semiconductor layers 723 may be SiGe layers, but the disclosure is not limited in this respect. In some embodiments, the dummy gate layer 724 may include, for example, polysilicon, other suitable materials, or combinations thereof. In some embodiments, each of the first and second semiconductor layers 722, 723 and the dummy gate layer 724 may be epitaxially formed using, for example, LPCVD, other suitable techniques, or combinations thereof.

Then, as shown in FIGS. 23, 24, 25 and 26, the dummy gate layer 724 and the semiconductor layer stack 721 are patterned to form a dummy gate strip 724' and a semiconductor strip stack 721' on the p-type well 702, and an STI layer 725 is formed on the p-type well 702 and the n-type wells 704 to cover the semiconductor strip stack 721'. The semiconductor strip stack 721' includes first semiconductor strips 722' and second semiconductor strips 723'. In some embodiments, the dummy gate layer 724 and the semiconductor layer stack 721 may be patterned using a photolithography process and an etching process. The photolithography process may include, for example, but not limited to, coating the dummy gate layer 724 with a photoresist, soft-baking, exposing the photoresist through a photomask, post-exposure baking, developing the photoresist, and hard-baking, so as to form a patterned photoresist. The etching process may be implemented by etching the dummy gate layer 724 and the semiconductor layer stack 721 through the patterned photoresist using, for example, dry etching, wet etching, RIE, ALE, other suitable techniques, or combinations thereof. The patterned photoresist may be removed after the etching process. In some embodiments, the STI layer 725 may be formed using, for example, CVD, PECVD, PVD, ALD, other suitable techniques, or combinations thereof. In some embodiments, the STI layer 725 may include, for example, oxide (e.g., silicon oxide), nitride, other suitable materials, or combinations thereof.

Next, as shown in FIGS. 25, 26, 27 and 28, the dummy gate strip 724' is patterned to form a dummy gate 724", and first spacers 725 are formed on sidewalls of the dummy gate 724". In some embodiments, the dummy gate strip 724' may be patterned using a photolithography process and an etching process similar to those used to pattern the dummy gate layer 724 and the semiconductor layer stack 721 (see FIGS. 22 and 23). In some embodiments, the first spacers 725 may be formed by conformally depositing a dielectric layer for forming the first spacers 725 using, for example, CVD, ALD, other suitable techniques, or combinations thereof, followed by one or more etching processes to selectively leave the first spacers 725 remaining on the sidewalls of the dummy gate 724". In some embodiments, the first spacers 725 may include, for example, B(C)N-based materials, $SiO_xC_yN_z$-based materials, silicon nitride, other suitable materials, or combinations thereof.

Then, as shown in FIGS. 27, 28, 29 and 30, the semiconductor strip stack 721' is patterned to form a semiconductor feature 721" that includes first semiconductor elements 722" and second semiconductor elements 723", the second semiconductor elements 723" are etched to form recesses at side portions thereof, and second spacers (i.e., inner spacers) 726 are formed to fill the recesses. In some embodiments, the semiconductor strip stack 721' may be patterned using a photolithography process and an etching process similar to those used to pattern the dummy gate layer 724 and the semiconductor layer stack 721 (see FIGS. 22 and 23). In some embodiments, the second semiconductor elements 723" may be etched using, for example, dry etching, wet etching, RIE, ALE, other suitable techniques, or combinations thereof. In some embodiments, the second spacers 726 may include B(C)N-based materials, $SiO_xC_yN_z$-based materials, silicon nitride, other suitable materials, or combinations thereof.

Figure 31:
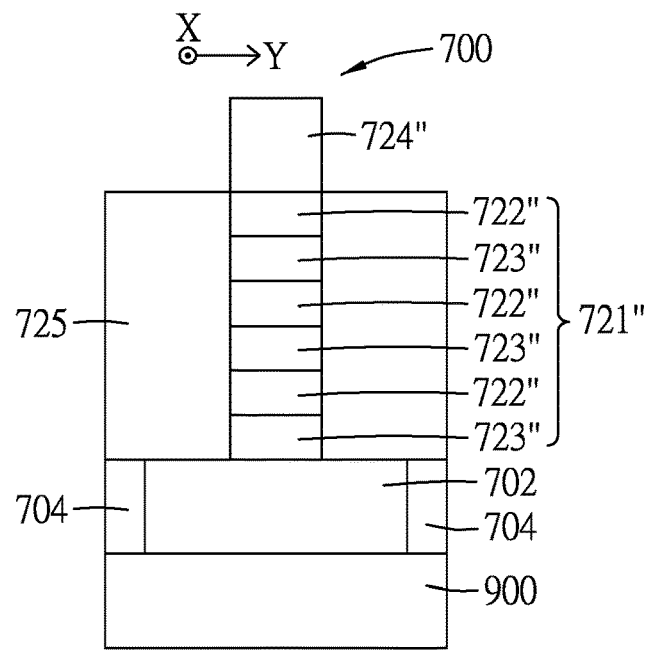
Figure 32:
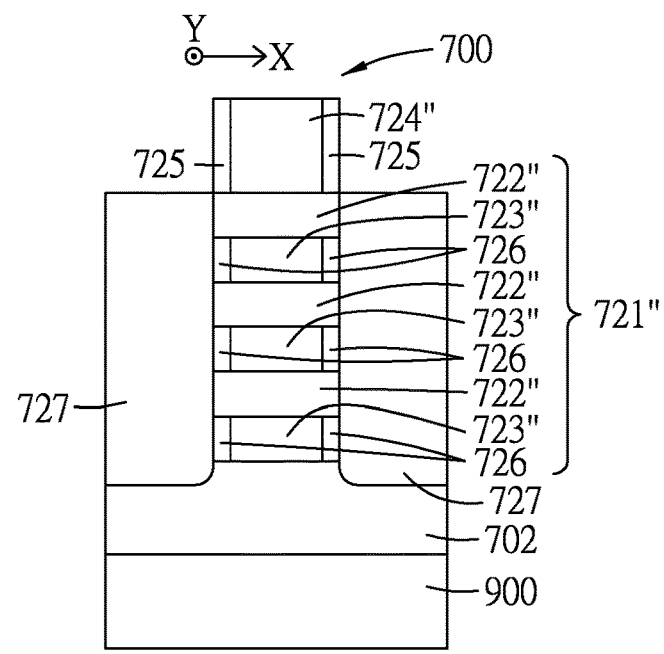
Figure 33:
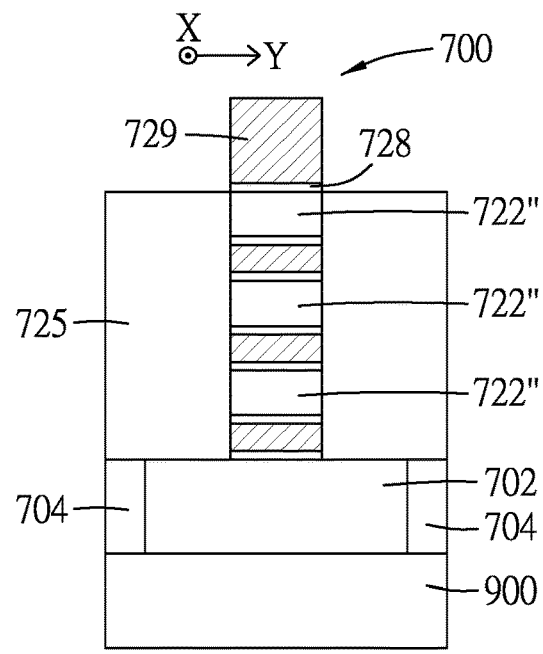
Figure 34:
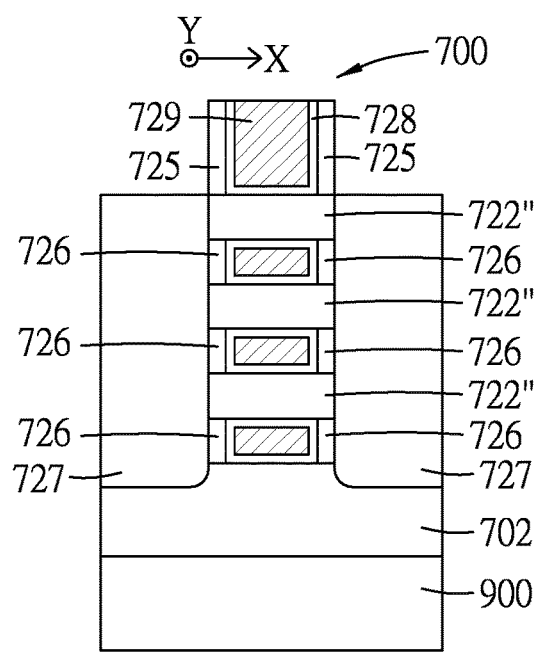

Next, as shown in FIGS. 31 and 32, source/drain electrodes 727 are formed at opposite sides of the semiconductor feature 721". In some embodiments, the source/drain electrodes 727 may be epitaxially formed using, for example, LPCVD, other suitable techniques, or combinations thereof. In some embodiments, the source/drain electrodes 727 may include, for example, silicon, silicon carbide, phosphorous doped silicon carbide, silicon phosphide, other suitable materials, or combinations thereof.

At last, as shown in FIGS. 31, 32, 33 and 34, the second semiconductor elements 723" and the dummy gate 724" are removed, a gate dielectric 728 is formed on the first semiconductor elements 722" thus exposed, and a gate electrode 729 is formed to surround the first semiconductor elements 722" that have been covered by the gate dielectric 728. In some embodiments, the second semiconductor elements 723" and the dummy gate 724" may be removed using, for example, drying etching, wet etching, RIE, ALE, other suitable techniques, or combinations thereof. In some embodiments, each of the gate dielectric 728 and the gate electrode 729 may be formed using, for example, PVD, CVD, ALD, other suitable techniques, or combinations thereof. In some embodiments, the gate dielectric 728 may include, for example, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, silicon oxynitrides (SiON), other suitable materials, or combinations thereof. In some embodiments, the gate electrode 729 may include, for example, Ti, Ag, Al, TiAlN, TaC, TaCN, TaSiN, Mn, Zr, TiN, TaN, Ru, Mo, Al, WN, Cu, W, other suitable materials, or combinations thereof.

A method for forming a p-type nanosheet FET on an n-type well 704 in accordance with some embodiments is similar to the method for forming an n-type nanosheet FET on a p-type well 702, but differs from the method for forming an n-type nanosheet FET on a p-type well 702 in that the source/drain electrodes 727 may include, for example, silicon-germanium, boron doped silicon-germanium, germanium, germanium tin, other suitable materials, or combinations thereof.

Figure 35:
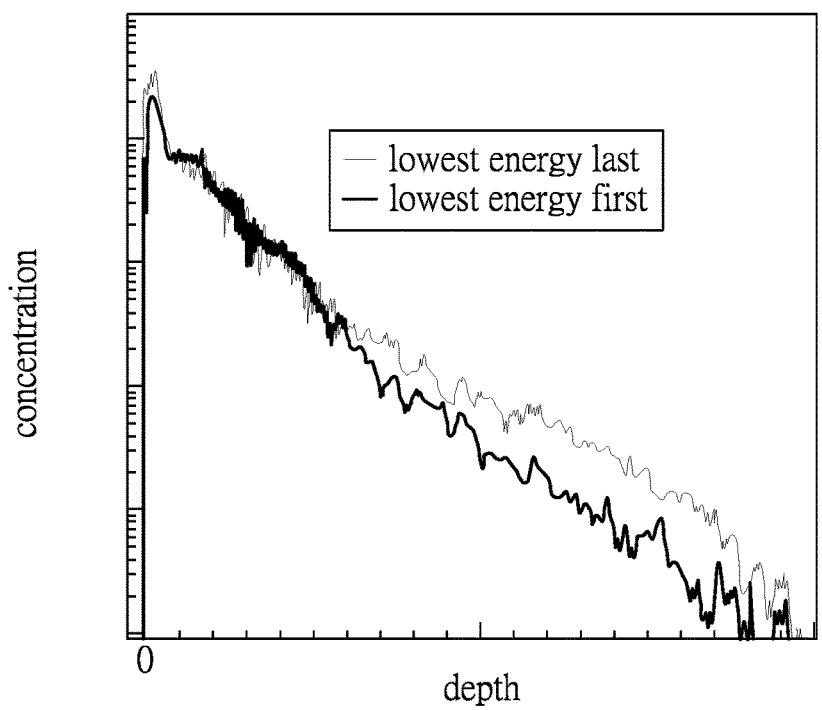
FIGS. 35 and 36 are plots each illustrating n-type dopant concentration versus depth characteristic of a semiconductor structure of FIG. 3 in a first condition where lowest energy ion implantation is performed last and a second condition where lowest energy ion implantation is performed first.
Figure 36:
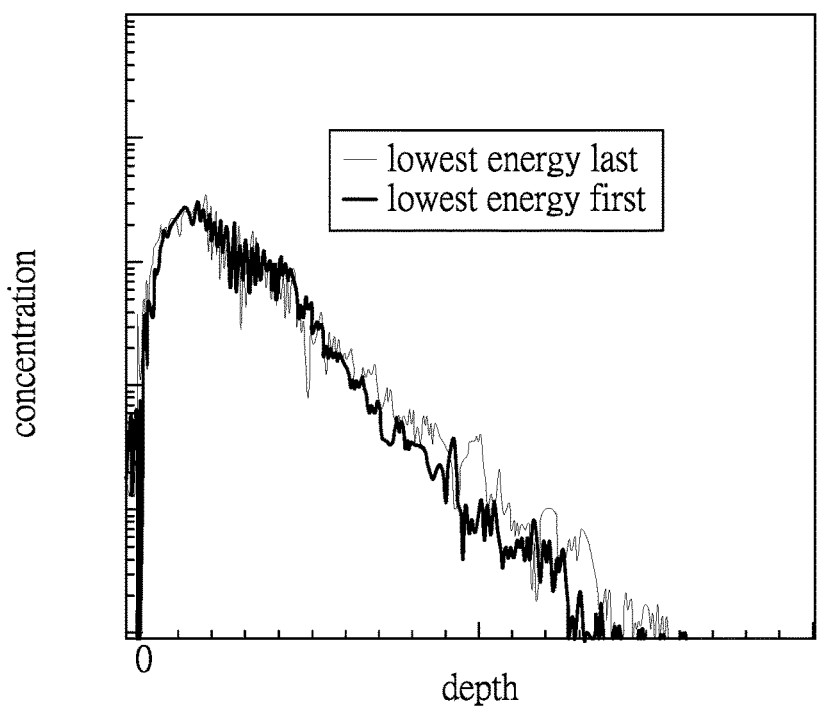

Referring to FIGS. 3, 35 and 36, each of FIGS. 35 and 36 is a plot illustrating n-type dopant concentration versus depth characteristic of the semiconductor structure 700 of FIG. 3 in a first condition and a second condition. The characteristic in FIG. 35 is taken along a boundary between two adjacent p-type and n-type wells 702, 704, beginning from a top surface of the two adjacent p-type and n-type wells 702, 704 downward. The characteristic in FIG. 36 is taken along a line that is parallel to the boundary between the two adjacent p-type and n-type wells 702, 704 and that passes through the most concave part of one of side walls of the masking layer 703 (in practice, the side walls of the masking layer 703 may be concave), beginning from the top surface of the two adjacent p-type and n-type wells 702, 704 downward, wherein said one of the side walls corresponds in position to the boundary between the two adjacent p-type and n-type wells 702, 704. In each of the first and second conditions, six n-type ion implantations are performed. In the first condition, at first, the n-type ion implantation that uses the energy of 120 keV and an ion dose of $4\times10^{13}$ cm$^{-2}$ is performed; then, the n-type ion implantation that uses the energy of 40 keV and the ion dose of $7\times10^{13}$ cm$^{-2}$ is performed; next, the n-type ion implantation that uses the energy of 52 keV and the ion dose of $8\times10^{13}$ cm$^{-2}$ is performed; then, the n-type ion implantation that uses the energy of 35 keV and the ion dose of $1\times10^{13}$ cm$^{-2}$ is performed; next, the n-type ion implantation that uses the energy of 25 keV and the ion dose of $1\times10^{13}$ cm$^{-2}$ is performed; and at last, the n-type ion implantation that uses the energy of 10 keV and the ion dose of $8\times10^{13}$ cm$^{-2}$ is performed. In other words, the n-type ion implantation that uses the lowest energy is performed last among the six n-type ion implantations. The total shrinkage of the masking layer 703 after the first to fifth n-type ion implantations are performed are 2.74 nm, 4.54 nm, 8.32 nm, 8.32 nm and 8.32 nm, respectively. In the second condition, at first, the n-type ion implantation that uses the energy of 10 keV and the ion dose of $8\times10^{13}$ cm$^{-2}$ is performed; then, the n-type ion implantation that uses the energy of 25 keV and the ion dose of $1\times10^{13}$ cm$^{-2}$ is performed; next, the n-type ion implantation that uses the energy of 35 keV and the ion dose of $1\times10^{13}$ cm$^{-2}$ is performed; then, the n-type ion implantation that uses the energy of 52 keV and the ion dose of $8\times10^{13}$ cm$^{-2}$ is performed; next, the n-type ion implantation that uses the energy of 40 keV and the ion dose of $7\times10^{13}$ cm$^{-2}$ is performed; and at last, the n-type ion implantation that uses the energy of 120 keV and the ion dose of $4\times10^{13}$ cm$^{-2}$ is performed. In other words, the n-type ion implantation that uses the lowest energy is performed first among the six n-type ion implantations. The total shrinkage of the masking layer 703 after the first to fifth n-type ion implantations are performed are 1.61 nm, 2.25 nm, 2.92 nm, 6.99 nm and 8.3 nm, respectively. It can be reasonably determined from FIGS. 35 and 36 that the p-type well 702 is less n-type doped in the second condition than in the first condition. Therefore, the sub-fin leakage in the n-type transistors formed on the p-type well 702 is lower in the second condition than in the first condition. In addition, the n-type dopants are distributed in a shallower portion of the p-type well 702 in the second condition than in the first condition. Therefore, a resistance of the p-type well 702 is lower in the second condition than in the first condition. Similarly, the sub-fin leakage in the p-type transistors formed on the n-type well 704 is lower in a third condition where the p-type ion implantation that uses the lowest energy is performed first among all p-type ion implantations than in a fourth condition where the p-type ion implantation that uses the lowest energy is performed last among all p-type ion implantations; and a resistance of the n-type well 704 is lower in the third condition than in the fourth condition.

In some embodiments, by performing the p-type ion implantation that uses the lowest energy first among all p-type ion implantations, and by performing the n-type ion implantation that uses the lowest energy first among all n-type ion implantations, in the sub-fin regions of any two adjacent p-type and n-type wells 702, 704 and around the boundary between the two adjacent p-type and n-type wells 702, 704, a portion that is subjected to both p-type ion implantation and n-type ion implantation would be smaller, as compared to when the lowest energy ion implantations are performed last, so sub-fin leakage in the transistors formed on the p-type and n-type wells 702, 704 can be effectively reduced. In addition, in this manner, the n-type dopants are distributed in a shallower portion of the p-type well 702, and the p-type dopants are distributed in a shallower portion of the n-type well 704, as compared to when the lowest energy ion implantations are performed last, so the resistance of the p-type well 702 and the resistance of the n-type well 704 can be relatively low.

In some embodiments, by heating the substrate 900 while performing the p-type ion implantation that uses the lowest energy, and by heating the substrate 900 while performing the n-type ion implantation that uses the lowest energy, less lateral diffusion of the p-type and n-type dopants from the sub-fin regions of the p-type and n-type wells 702, 704 into the sub-fin regions of the n-type and p-type wells 704, 702 would occur when annealing the p-type and n-type wells 702, 704, so sub-fin leakage in the transistors formed on the p-type and n-type wells 702, 704 can be further reduced.

In accordance with some embodiments of the present disclosure, a method for manufacturing a semiconductor device includes: forming a first type well in a substrate; and after forming the first type well in the substrate, forming a second type well in the substrate, the second type well having a conductivity type different from that of the first type well. One of the first and second type wells is formed by sequentially performing multiple first ion implantations that use different energies, and one of the first ion implantations that uses a lowest energy among the first ion implantations is performed first among the first ion implantations.

In accordance with some embodiments of the present disclosure, the other one of the first and second type wells is formed by sequentially performing multiple second ion implantations that use different energies, and one of the second ion implantations that uses a lowest energy among the second ion implantations is performed first among the second ion implantations.

In accordance with some embodiments of the present disclosure, the first ion implantation that uses the lowest energy is performed to implant boron into the substrate, and the lowest energy falls within a range of from 3 keV to 7 keV.

In accordance with some embodiments of the present disclosure, the first ion implantation that uses the lowest energy is performed to implant $BF_2$ into the substrate, and the lowest energy falls within a range of from 10 keV to 20 keV.

In accordance with some embodiments of the present disclosure, the first ion implantation that uses the lowest energy is performed to implant phosphorus into the substrate, and the lowest energy falls within a range of from 7 keV to 13 keV.

In accordance with some embodiments of the present disclosure, the first ion implantation that uses the lowest energy is performed to implant arsenic into the substrate, and the lowest energy falls within a range of from 10 keV to 20 keV.

In accordance with some embodiments of the present disclosure, the first ion implantation that uses the lowest energy is performed to implant dopants into the substrate such that a concentration of the dopants implanted into the substrate by said first ion implantation falls within a range of from $1\times10^{19}$ cm$^{-3}$ to $5\times10^{19}$ cm$^{-3}$.

In accordance with some embodiments of the present disclosure, each of the first ion implantations is a tilt implantation, and is performed at an angle that is greater than 0 degrees and that is smaller than or equal to 15 degrees.

In accordance with some embodiments of the present disclosure, each of the first ion implantations is a rotational implantation, and is performed as the substrate is being rotated by angles that fall between 0 and 360 degrees.

In accordance with some embodiments of the present disclosure, each of the first ion implantations is performed at a temperature that falls within a range of from −60° C. to 450° C.

In accordance with some embodiments of the present disclosure, a method for manufacturing a semiconductor device includes: forming a well in a substrate by sequentially performing multiple ion implantations that use different energies, where one of the ion implantations that uses a lowest energy among the ion implantations is performed first among the ion implantations; and forming a transistor on the well.

In accordance with some embodiments of the present disclosure, the ion implantation that uses the lowest energy is performed to implant dopants into the substrate such that a concentration of the dopants implanted into the substrate by said ion implantation falls within a range of from $1\times10^{19}$ $cm^{-3}$ to $5\times10^{19}$ $cm^{-3}$.

In accordance with some embodiments of the present disclosure, each of the ion implantations is a tilt implantation, and is performed at an angle that is greater than 0 degrees and that is smaller than or equal to 15 degrees.

In accordance with some embodiments of the present disclosure, each of the ion implantations is a rotational implantation, and is performed as the substrate is being rotated by angles that fall between 0 and 360 degrees.

In accordance with some embodiments of the present disclosure, each of the ion implantations is performed at a temperature that falls within a range of from −60° C. to 450° C.

In accordance with some embodiments of the present disclosure, a method for manufacturing a semiconductor device includes: forming a well in a substrate by sequentially performing multiple ion implantations that use different energies, where one of the ion implantations that uses a lowest energy among the ion implantations is performed first among the ion implantations while the substrate is being heated; and annealing the well.

In accordance with some embodiments of the present disclosure, the ion implantation that uses the lowest energy is performed to implant boron into the substrate, and the lowest energy falls within a range of from 3 keV to 7 keV.

In accordance with some embodiments of the present disclosure, the ion implantation that uses the lowest energy is performed to implant $BF_2$ into the substrate, and the lowest energy falls within a range of from 10 keV to 20 keV.

In accordance with some embodiments of the present disclosure, the ion implantation that uses the lowest energy is performed to implant phosphorus into the substrate, and the lowest energy falls within a range of from 7 keV to 13 keV.

In accordance with some embodiments of the present disclosure, the ion implantation that uses the lowest energy is performed to implant arsenic into the substrate, and the lowest energy falls within a range of from 10 keV to 20 keV.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first type well in a substrate; and
   after forming the first type well in the substrate, forming a second type well in the substrate, where the second type well has a conductivity type different from a conductivity type of the first type well;
   wherein one of the first type well and the second type well is formed by sequentially performing multiple first ion implantations that use different energies, the other one of the first type well and the second type well is formed by sequentially performing multiple second ion implantations that use different energies, one of the first ion implantations that uses a lowest energy among the first ion implantations is performed first among the first ion implantations, and the second ion implantations are sequentially performed in an order different from an order of the first ion implantations.

2. The method according to claim 1, wherein one of the second ion implantations that uses a lowest energy among the second ion implantations is performed first among the second ion implantations.

3. The method according to claim 1, wherein the first ion implantation that uses the lowest energy is performed to implant boron into the substrate, and the lowest energy falls within a range of from 3 keV to 7 keV.

4. The method according to claim 1, wherein the first ion implantation that uses the lowest energy is performed to implant $BF_2$ into the substrate, and the lowest energy falls within a range of from 10 keV to 20 keV.

5. The method according to claim 1, wherein the first ion implantation that uses the lowest energy is performed to implant phosphorus into the substrate, and the lowest energy falls within a range of from 7 keV to 13 keV.

6. The method according to claim 1, wherein the first ion implantation that uses the lowest energy is performed to implant arsenic into the substrate, and the lowest energy falls within a range of from 10 keV to 20 keV.

7. The method according to claim 1, wherein the first ion implantation that uses the lowest energy is performed to implant dopants into the substrate such that a concentration of the dopants implanted into the substrate by said first ion implantation falls within a range of from $1\times10^{19}$ $cm^{-3}$ to $5\times10^{19}$ $cm^{-3}$.

8. The method according to claim 1, wherein each of the first ion implantations is a tilt implantation, and is performed at an angle that is greater than 0 degrees and that is smaller than or equal to 15 degrees.

9. The method according to claim 1, wherein each of the first ion implantations is a rotational implantation, and is performed as the substrate is being rotated by angles that fall between 0 and 360 degrees.

10. The method according to claim 1, wherein each of the first ion implantations is performed at a temperature that falls within a range of from −60° C. to 450° C.

11. A method for manufacturing a semiconductor device, comprising:
    forming a first type well in a substrate by sequentially performing multiple first ion implantations that use different energies through an opening of a first masking layer, where one of the first ion implantations that uses a lowest energy among the first ion implantations is performed first among the first ion implantations and causes expansion of the opening of the first masking layer; and after forming the first type well in the substrate, forming a second type well in the substrate by sequentially performing multiple second ion implantations that use different energies through an opening of a second masking layer, where the second type well has a conductivity type different from a conductivity type of the first type well and is laterally contiguous to the first type well, and one of the second ion implantations that uses a lowest energy among the second ion implantations is performed first among the second ion implantations and causes expansion of the opening of the second masking layer.

12. The method according to claim 11, wherein the first ion implantation that uses the lowest energy is performed to implant dopants into the substrate such that a concentration of the dopants implanted into the substrate by said first ion implantation falls within a range of from $1 \times 10^{19}$ cm$^{-3}$ to $5 \times 10^{19}$ cm$^{-3}$.

13. The method according to claim 11, wherein each of the first ion implantations is a tilt implantation, and is performed at an angle that is greater than 0 degrees and that is smaller than or equal to 15 degrees.

14. The method according to claim 11, wherein each of the first ion implantations is a rotational implantation, and is performed as the substrate is being rotated by angles that fall between 0 and 360 degrees.

15. The method according to claim 11, wherein each of the first ion implantations is performed at a temperature that falls within a range of from −60° C. to 450° C.

16. A method for manufacturing a semiconductor device, comprising:

forming a well in a substrate by sequentially performing at least three ion implantations that use different energies, where one of the ion implantations that uses a lowest energy among the ion implantations is performed first among the ion implantations, and an energy used by one of the ion implantations that is performed secondly among the ion implantations is higher than an energy used by one of the ion implantations that is performed thirdly among the ion implantations;

annealing the well; and after annealing the well, forming a gate electrode of a transistor on the well.

17. The method according to claim 16, wherein the ion implantation that uses the lowest energy is performed to implant boron into the substrate, and the lowest energy falls within a range of from 3 keV to 7 keV.

18. The method according to claim 16, wherein the ion implantation that uses the lowest energy is performed to implant BF$_2$ into the substrate, and the lowest energy falls within a range of from 10 keV to 20 keV.

19. The method according to claim 16, wherein the ion implantation that uses the lowest energy is performed to implant phosphorus into the substrate, and the lowest energy falls within a range of from 7 keV to 13 keV.

20. The method according to claim 16, wherein the ion implantation that uses the lowest energy is performed to implant arsenic into the substrate, and the lowest energy falls within a range of from 10 keV to 20 keV.

* * * * *